United States Patent
Wang et al.

(10) Patent No.: US 7,389,486 B2
(45) Date of Patent: Jun. 17, 2008

(54) ARC ROUTING SYSTEM AND METHOD

(75) Inventors: Qian Wang, Taipei (TW); Melissa Feng, Taipei (TW); Bg Fan, Taipei (TW)

(73) Assignee: Inventec Corporation (TW)

( * ) Notice: Subject to any disclaimer, the term of this patent is extended or adjusted under 35 U.S.C. 154(b) by 258 days.

(21) Appl. No.: 11/393,072

(22) Filed: Mar. 29, 2006

(65) Prior Publication Data
US 2007/0118829 A1    May 24, 2007

(30) Foreign Application Priority Data
Nov. 23, 2005 (TW) .............................. 94141079 A

(51) Int. Cl.
*G06F 17/50* (2006.01)
(52) U.S. Cl. ....................................................... 716/15
(58) Field of Classification Search ...................... None
See application file for complete search history.

(56) References Cited
U.S. PATENT DOCUMENTS

| | | | |
|---|---|---|---|
| 4,744,047 A * | 5/1988 | Okamoto et al. ........... 382/147 |
| 6,226,560 B1 * | 5/2001 | Hama et al. ................... 700/97 |
| 6,629,305 B2 * | 9/2003 | Ito et al. ........................ 716/11 |
| 6,662,351 B2 * | 12/2003 | Kitamura et al. ............. 716/11 |
| 7,240,317 B2 * | 7/2007 | Ito et al. ........................ 716/11 |

* cited by examiner

*Primary Examiner*—Leigh Marie Garbowski
(74) *Attorney, Agent, or Firm*—Peter F. Corless; Steven M. Jensen; Edwards Angell Palmer & Dodge LLP

(57) ABSTRACT

An arc routing system and method are disclosed, which are integrated to a PCB (printed circuit board) routing system for assisting the PCB routing system to route wires in an area of a printed circuit board with high component density. First, three neighboring points in a routing direction in the area of the printed circuit board are selected by a selecting module, wherein one of the three points is located on one side of a line extending in the routing direction and the two others are located on the other side of the line. Then, information related to the three selected points and routing information are read by a reading module. Subsequently, the center point, radius, start point and end point for an arc-shaped wire to be routed are set by a setting module. Finally, the arc-shaped wire is drawn by a drawing module. Thereby, routing efficiency is increased and electrical connection performance of printed circuit boards is improved.

10 Claims, 3 Drawing Sheets

ARC ROUTING SYSTEM AND METHOD

BACKGROUND OF THE INVENTION

1. Field of the Invention

The present invention relates to arc routing systems and methods thereof, and more particularly to an arc routing system and method that can route an area of a printed circuit board with high component density.

2. Description of Related Art

Routing of printed circuit boards has ranged from hand layout to autorouting of all wires. The need to complete routing rapidly and correctly with large numbers of nets and electrical constraints has driven the development and use of specialized autorouters. However, for an area of a printed circuit board with high component density, hand layout is preferred to optimize the routing.

For an area of a printed circuit board with high component density, keepout regions are usually formed around each component in order to avoid signal crosstalk and short circuits. As a result, signal lines should be taken round and kept away from many keepout regions. Thus, a routing engineer needs to route a wire piece by piece by try and error method, which not only results in a low routing speed but also results in irregular wires. The irregular wires will adversely affect the signal transferring. Meanwhile, the irregular wires introduce electrical and signal resistances, thereby decreasing the electrical connection performance of printed circuit boards.

Accordingly, there is a need to develop an arc routing system and method to simplify routing, increase routing efficiency and improving electrical connection performance of printed circuit boards.

SUMMARY OF THE INVENTION

According to the above defects, an objective of the present invention is to provide an arc routing system and method which can increase routing efficiency.

Another objective of the present invention is to provide an arc routing system and method which can improve electrical connection performance of printed circuit boards.

To achieve the above and other objectives, the present invention discloses an arc routing system and method, which are integrated to a PCB (printed circuit board) routing system for assisting the PCB routing system to route wires in an area of a printed circuit board with high component density. The arc routing system comprises: a selecting module for selecting three neighboring points in a routing direction in the area of the printed circuit board with high component density, wherein one of the three points is located on one side of a line extending in the routing direction and the two others are located on the other side of the line; a reading module for reading information related to the selected three points and routing information; a setting module for setting the center point, radius, start point and end point for an arc-shaped wire to be routed according to the information read by the reading module; and a drawing module for drawing the arc-shaped wire according to the center point, the radius, the start point and the end point set by the setting module and the routing information read by the reading module.

Each of the selected three points is a component, which is one of a pad, a pin and a via.

The arc routing method of the present invention can be applied to an arc routing system which is integrated to a PCB (printed circuit board) routing system for assisting the PCB routing system to route wires in an area of a printed circuit board with high component density. The arc routing method comprises: selecting three neighboring points in a routing direction in the area of the printed circuit board with high component density, wherein one of the three points is located on one side of a line extending in the routing direction and the two others are located on the other side of the line; reading information related to the three selected points and routing information; setting the center point, radius, start point and end point for an arc-shaped wire to be routed according to the information read by the reading module; and drawing the arc-shaped wire according to the center point, the radius, the start point, the end point and the routing information.

Therefore, the arc routing system and method of the present invention can route arc-shaped wires in an area of a printed circuit board with high component density. Because the arc-shaped wires are much smoother, electrical connection performance of printed circuit boards is improved. In addition, the arc routing system and method of the present invention facilitates wire routing and increase routing efficiency

DETAILED DESCRIPTION OF PREFERRED EMBODIMENTS

Hereunder, embodiments of the present invention will be described in full detail with reference to the accompanying drawings.

Figure 1:
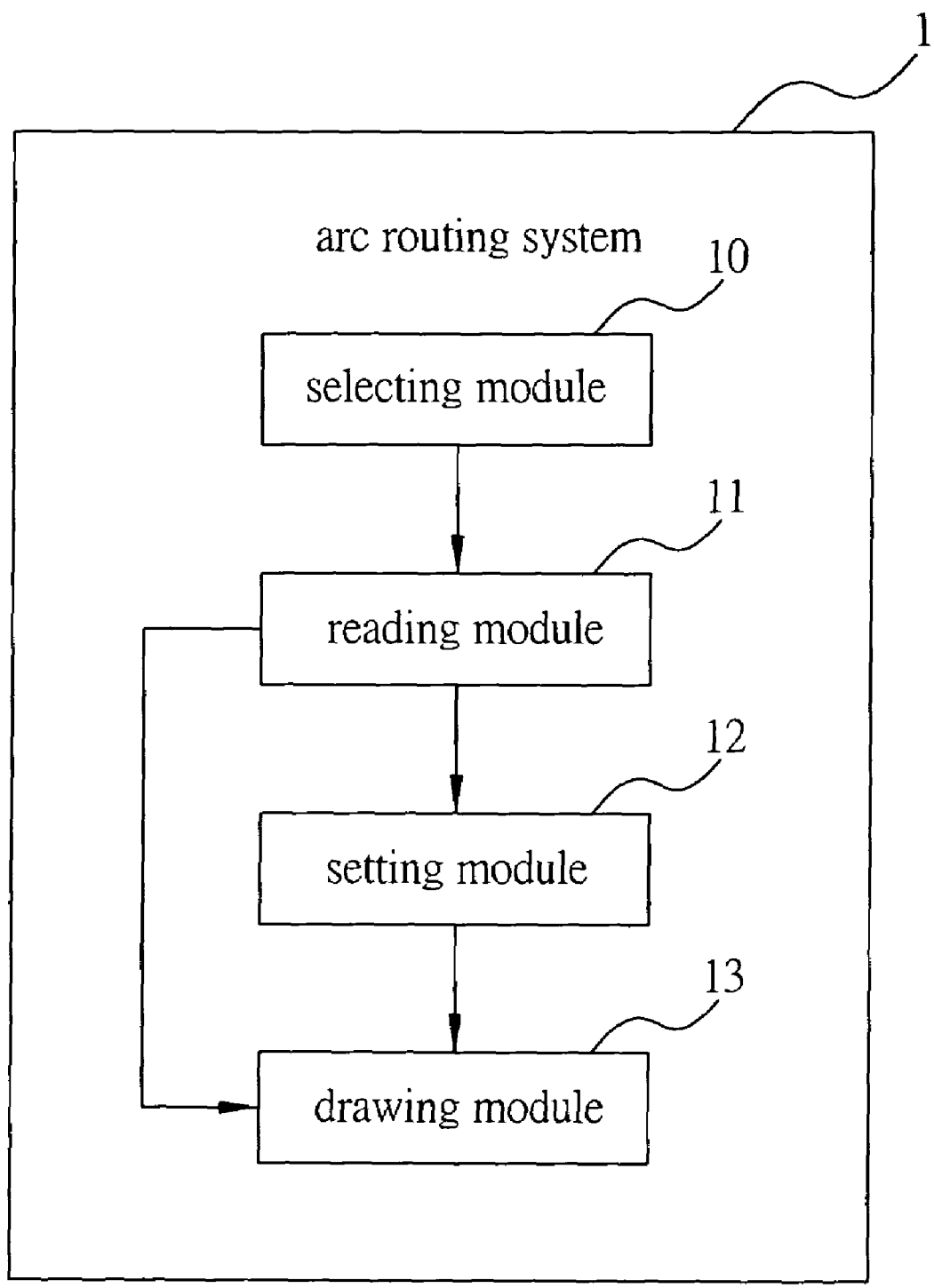
FIG. 1 is a block diagram of an arc routing system according to the present invention.

FIG. 1 is a block diagram of an arc routing system according to the present invention. The arc routing system of the present invention can be used to route wires in an area of a printed circuit board with high component density, wherein, said component can be a pad, a pin or a via. The arc routing system can be integrated or linked to a conventional routing system (software) such as Allegro software. While routing a printed circuit board by a routing system, if it comes to an area with high component density, the arc routing system of the present invention can be called by the routing system to route this area. The detailed construction of the arc routing system of the present invention is described as follows.

Referring to FIG. 1, the arc routing system 1 of the present invention comprises a selecting module 10, a reading module 11, a setting module 12 and a drawing module 13.

The selecting module 10 is used to select three neighboring points A, B and C in a routing direction in an area of a printed circuit board with high component density, wherein point A is located on one side of a line extending in the routing direction and points B and C are sequentially located on the other side of the line extending in the routing direction.

The three points can be manually selected by a user or automatically selected by the arc routing system 1 through the selecting module 10. To manually select the points, the selecting module 10 is linked to a database of the PCB routing system (software) that contains component information and routing information, and a user interface is created which at least shows the routing information and the distribution of the components in the area of the printed circuit board with high component density, such that a user can select three neighboring points by mouse click or keyboard input. Each of the selected points can be a component such as a pad, a pin or a via or any point between two adjacent routed wires. In the present embodiment, three pads A, B and C are selected as three points. Around each of the pad, there is formed a keepout area. The routed wires are kept away from these keepout areas in order to prevent short circuit or signal crosstalk.

The reading module 11 reads information related to the selected three points A, B and C and routing information. In the present embodiment, by linking the arc routing system 1 to the PCB routing system (software), the reading module 11 can read information such as the center point coordinates and radius of the selected three pads, the minimum distance allowed between the selected pads and wires, the number and width of the wires to be routed, and the minimum distance between adjacent wires.

The setting module 12 sets the center point, radius, start point and end point for an arc-shaped wire to be routed according to the information read by the reading module 11. In the present embodiment, the center point of the selected pad A is set as the center point for the arc-shaped wire to be routed.

Figure 2:
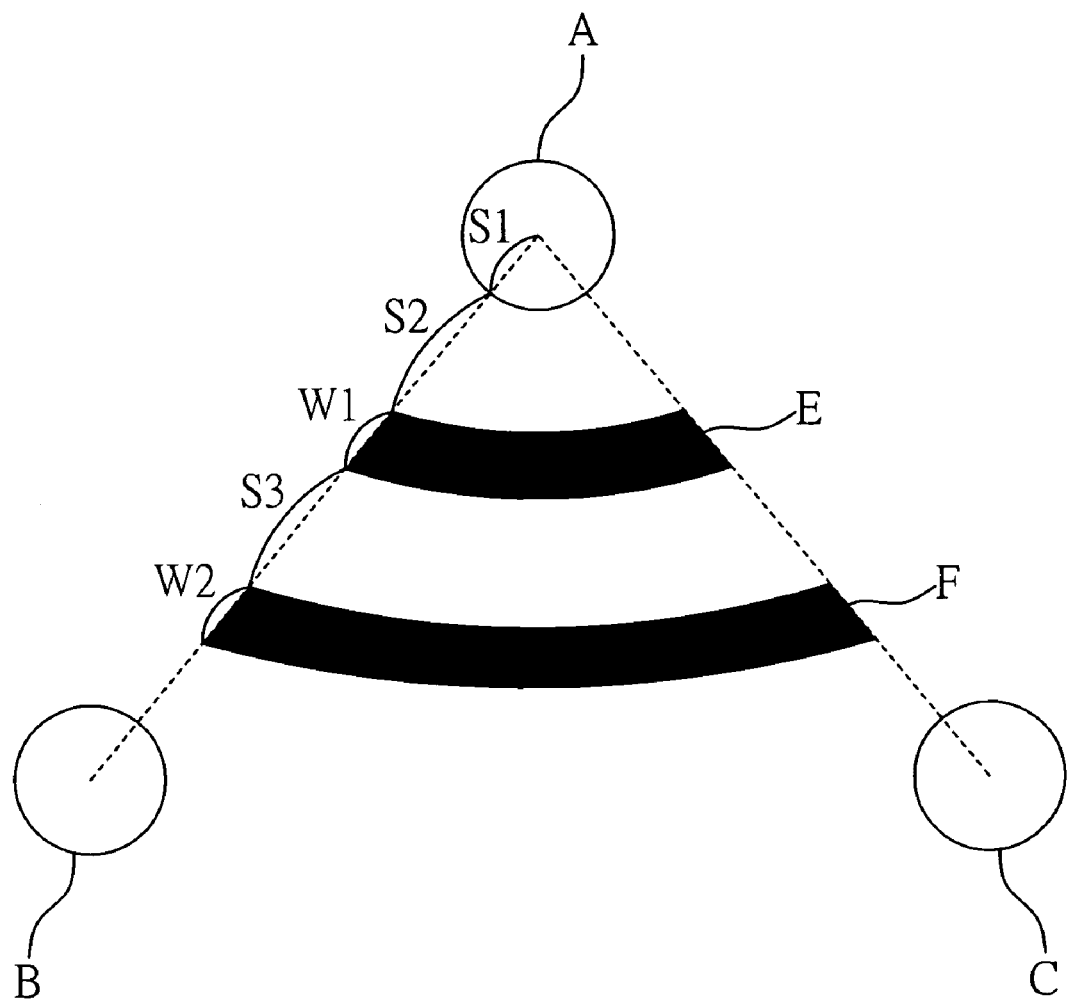
FIG. 2 is a diagram of arc-shaped wires that are drawn according to one embodiment of the present invention.

Referring to FIG. 2, a method of setting radii for two arc-shaped wires to be routed is illustrated. First, the minimum distance from the center point of the selected pad A to a wire is set as the radius of the first arc-shaped wire. For example, if S1 is the radius of the selected pad A read by the reading module 11, S2 is the minimum distance from the periphery of the selected pad A to a wire, the width of the arc-shaped wire to be routed is require to be W1, then, the minimum distance from the center point of the selected pad A to the center line of the first arc-shaped wire to be routed should be $S=S1+S2+W1/2$, wherein, S is the radius of the first arc-shaped wire. Then, the radius for the second arc-shaped wire to be routed is obtained according to the minimum distance requirement between wires and the required width of the arc-shaped wire to be routed. For example, if the minimum distance required between wires is S3 and the required width of the arc-shaped wire to be routed is W2, the radius of the second arc-shaped wire to be routed is $S'=S+W1/2+S3+W2/2$. The start points of the arc-shaped wires to be routed can be set as intersection points between the arc-shaped wires to be routed and the straight line connecting the center points of pads A and B. The end points of the arc-shaped wires to be routed can be set as intersection points between the arc-shaped wires to be routed and the straight line connecting the center points of pads A and C. The coordinates of the start points and the end points can be calculated according to the coordinates of the selected pads A, B and C. It should be noted that the radius, the start points and the end points of the arc-shaped wires to be routed can be modified according to needs. For example, if there is an intersection point between a previous routed wire and the straight line between center points of pads A and B, the distance from the center point of pad A to the intersection point can be set as the radius of an arc-shaped wire to be routed, provided that the distance meets the routing requirement, and the intersection point can be set as the start point, Similarly, the end point of an arc-shaped wire to be routed can be set as an intersection point between the straight line between center points of pads A and C and a subsequent wire.

The radius, start point and end point for an arc-shaped wire to be routed can further be set manually by a user. By creating a user interface according the information read by the reading module 11, a user can set the radius, start point and end point on the user interface by mouse click or keyboard input.

The drawing module 13 draws an arc-shaped wire according to the center point, the radius, the start point and the end point set by the setting module 12 and the routing information read by the reading module 11.

As shown in FIG. 2, two arc-shaped wires E, F are drawn between the pads A, B and C, wherein the center points of the arc-shaped wires E, F are center point of pad A, the radii of the arc-shaped wires E, F are respectively S and S', the widths of the arc-shaped wires E, F are respectively W1 and W2.

Figure 3:
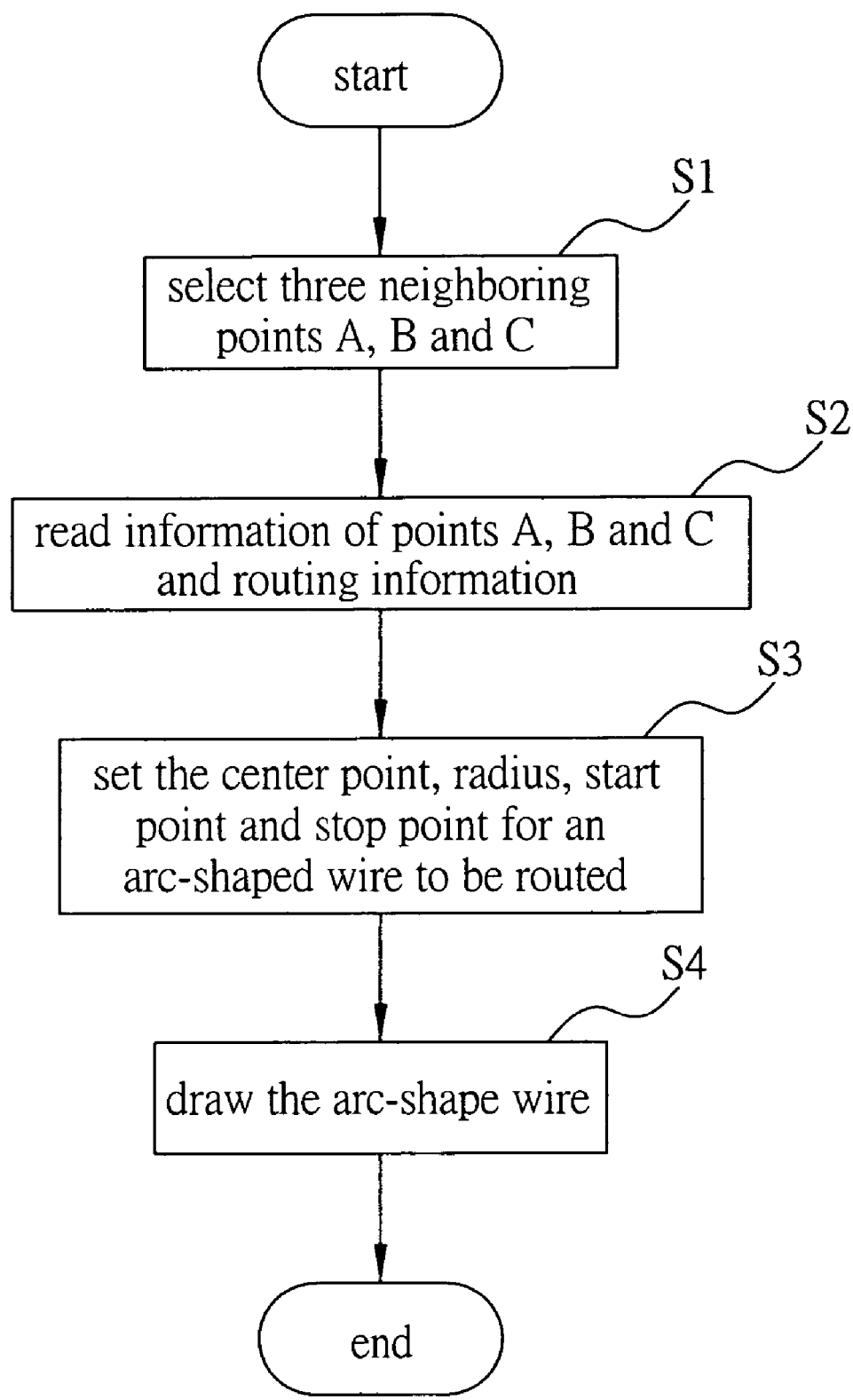
FIG. 3 is a diagram showing the steps of an arc routing method of the present invention.

FIG. 3 shows the steps of an arc routing method according to the present invention. The arc routing method can be applied to an arc routing system as illustrated above. As seen in FIG. 3, first at step S1, three neighboring points A, B and C are selected by a selecting module in a routing direction, wherein point A is located on one side of a line extending in the routing direction, and points B and C are located on the other side of the line. Then, routine proceeds to step S2.

At step S2, information related to points A, B and C and routing information are read by a reading module. Then, routine proceeds to step S3.

At step S3, according to the information read by the reading module, the center point, radius, start point and stop point for an arc-shaped wire to be routed are set.

At step S4, the arc-shaped wire is drawn according to the information set by the setting module and the routing information reading by the read module, thereby routing the wire between point A and points B, C.

The above steps from S1 to S4 are repeated until the area of the printed circuit board with high component density is completely routed.

Compared with the prior art, routed arc-shaped wires of present invention are much smoother, thereby improving electrical connection performance of printed circuit boards. In addition, the method of routing arc-shaped wires is simple and easy to operate, thereby increasing routing efficiency.

However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An arc routing system integrated to a PCB (printed circuit board) routing system for assisting the PCB routing system to route wires in an area of a printed circuit board with high component density, the arc routing system comprising:

a selecting module for selecting three neighboring points in a routing direction in the area of the printed circuit board with high component density, wherein one of the three neighboring points is located on one side of a line extending in the routing direction and the two others are located on the other side of the line;

a reading module for reading information related to the selected three points and reading routing information;

a setting module for setting a center point, a radius, a start point and an end point for an arc-shaped wire to be routed according to the information read by the reading module; and a drawing module for drawing the arc-shaped wire according to the center point, radius, start point and end point set by the setting module and the routing information read by the reading module.

2. The arc routing system of claim 1, wherein each of the selected three points is a component, which is one of a pad, a pin and a via.

3. The arc routing system of claim 1, wherein the start point and the end point are intersection points between the arc-shaped wire and lines connecting two of the three selected points located on opposite sides of the line extending in the routing direction, respectively.

4. The arc routing system of claim 1, wherein the start point of the arc-shaped wire is an intersection point between a previous wire and a line connecting two of the three selected points located on opposite sides of the line extending in the routing direction.

5. The arc routing system of claim 1, wherein the end point of the arc-shaped wire is an intersection point between a subsequent wire and a line connecting two of the three selected points located on opposite sides of the line extending in the routing direction.

6. An arc routing method applicable to an arc routing system which is integrated to a PCB (printed circuit board) routing system for assisting the PCB routing system to route wires in an area of a printed circuit board with high component density, the arc routing method comprising:
   selecting three neighboring points in a routing direction in the area of the printed circuit board with high component density, wherein one of the three points is located on one side of a line extending in the routing direction and the two others are located on the other side of the line;
   reading via a reading module information related to the three selected points and routing information;
   setting a center point, a radius, a start point and an end point for an arc-shaped wire to be routed according to the information read by the reading module; and
   drawing the arc-shaped wire according to the set center point, radius, start point, end point and routing information.

7. The arc routing method of claim 6, wherein each of the selected three points is a component, which is one of a pad, a pin and a via.

8. The arc routing method of claim 6, wherein the start point and the end point are intersection points between the arc-shaped wire and lines connecting two of the three selected points located on opposite sides of the line extending in the routing direction, respectively.

9. The arc routing method of claim 6, wherein the start point of the arc-shaped wire is an intersection point between a previous wire and a line connecting two of the three selected points located on opposite sides of the line extending in the routing direction.

10. The arc routing method of claim 6, wherein the end point of the arc-shaped wire is an intersection point between a subsequent wire and a line connecting two of the three selected points located on opposite sides of the line extending in the routing direction.

* * * * *